US005362450A

United States Patent [19]
Russell et al.

[11] Patent Number: 5,362,450
[45] Date of Patent: Nov. 8, 1994

[54] LASER CONTROLLED DECOMPOSITION OF CHLOROFLUOROCARBONS

[75] Inventors: Stephen D. Russell; Douglas A. Sexton, both of San Diego, Calif.

[73] Assignee: The United States of America as represented by the Secretary of the Navy, Washington, D.C.

[21] Appl. No.: 664,046

[22] Filed: Feb. 21, 1991

Related U.S. Application Data

[63] Continuation-in-part of Ser. No. 501,707, Mar. 29, 1990.

[51] Int. Cl.$^5$ .............................................. B01J 19/12
[52] U.S. Cl. ............................ 422/186.3; 422/176.16; 422/186.1; 422/24
[58] Field of Search ............. 422/186.1, 186.3, 186.15, 422/186.16, 24

[56] References Cited

U.S. PATENT DOCUMENTS

| | | | |
|---|---|---|---|
| 4,045,316 | 8/1977 | Legan | 204/158 R |
| 4,780,287 | 10/1988 | Zeff et al. | 422/186.3 |
| 4,801,763 | 1/1989 | Maul et al. | 570/177 |
| 4,849,558 | 7/1989 | Goodman | 570/179 |
| 4,856,289 | 8/1989 | Lofland | 62/149 |

OTHER PUBLICATIONS

*Excimer Laser-assisted Etching . . . Chloropenta Fluoroethane,* Russell et al, Mat. Res. Soc. Proc., vol. 158, 1990 pp. 325-330.
CRC Handbook of Chemistry & Physics, Weast, 67th Edition, CRC Press, 1986, pp. B82, B126-B127.
Halogen Chemistry, Gutmann, vol. 2, Academic Press, 1967, pp. 173-180.
*Matheson Gas Book Data,* Braker et al, Matheson Gas Products, 1980, p. 633.

Excimer and Dye Lasers . . . Atmosphere, *Lambda Highlights,* Brinkmann, Aug. 1988, pp. 1-3.
*Release of Industrial Halocarbons . . . Budget,* Jesson et al, Proc. of Nato . . . Influences, FAA-EE-80-20, May, 1980 pp. 373-396.
Free Radicals-Results, Anderson, Proc. of NATO . . . InfluencesFAA-EE-80-20, May 1980, pp. 233-251.
*UV Photoabsorption . . . for Halocarbons,* Robbins, NASA-CR-154106, pp. 255-257, 1976.
Large Losses of Total Ozone . . . Interaction, Farman et al., *Nature,* vol. 315, 1985, pp. 207-210.
Charting the Ozone Alert, Dubinsky, *Lasers and Optronics,* vol. 8, 1989, pp. 45-54.
Stratospheric Sink . . . Ozone, Molina et al., *Nature,* vol. 249, 1974, pp. 810-812.
Global Trends in Total Ozone, Bowman, *Science,* vol. 239, 1988, pp. 48-50.
Summ, U.S. Nat'l Academy of Sciences Report: Stratospheric Ozone Depletion of Hydrocarbons: Chem. & Transport, FAA-EE-80-20, May 1980, pp. 967-975.
The Changing Atmosphere, Graedel et al., *Scientic American,* vol. 261, 1989, pp. 58-68.
The Antartic Ozone Hole, Stolarski, *Scientific American*vol. 258, 1988, pp. 30-36.
Nimbus 7 Satellite Measurements . . . Decrease, Stolarski et al., *Nature,* vol. 322, 1986, pp. 808-811.

*Primary Examiner*—Peter A. Nelson
*Attorney, Agent, or Firm*—Harvey Fendelman; Thomas Glenn Keough

[57] ABSTRACT

A method to decompose chlorofluorocarbons gases (CFCs) enables the conventional disposal of their by-products. It employs photodecomposition of the CFC gas using UV light and a mediating species to allow chemical reactions to occur which form an effluent which is hydrolyzed by conventional methods.

18 Claims, 2 Drawing Sheets

LASER CONTROLLED DECOMPOSITION OF CHLOROFLUOROCARBONS

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATION

This application is a continuation in part of a co-pending patent application entitled "Method for Laser-Assisted Silicon Etching Using Halocarbon Ambients" by Stephen D. Russell et al., U.S. patent application Ser. No. 07/501,707, filed on Mar. 29, 1990.

BACKGROUND OF THE INVENTION

Recent studies have emphasized the current concern over the use of chlorofluorocarbons (CFCs) and their effect on our environment, please refer to "Summary of the U.S. National Academy of Sciences Report: Stratospheric Ozone Depletion by Halocarbons: Chemistry and Transport" by H. I. Schiff in A. C. Aikin, editor, *Proceedings of the NATO Advanced Study Institute on Atmospheric Ozone: Its Variation and Human Influences*, FAA-EE-80-20, May 1980, pp. 967–975; "The Changing Atmosphere", by T. E. Graedel et al. in *Scientific American*, vol. 261, 1989, pp. 58–68; "The Antarctic Ozone Hole", by R. S. Stolarski, in *Scientific American*, vol. 258, 1988, pp. 30–36; "Nimbus 7 Satellite Measurements of the Springtime Antarctic Ozone Decrease", by R. S. Stolarski et al. in *Nature*, vol. 322, 1986, pp. 808–811; "Large Losses of Total Ozone in Antarctica Reveal Seasonal ClO$_x$/NO$_x$ Interaction", by J. C. Farman et al. in *Nature*, vol. 315, 1985, pp. 207–210; "Charting the Ozone Alert", by R. N. Dubinsky, in *Lasers and Optronics*, vol. 8, 1989, pp. 45–54; "Stratospheric Sink for Chlorofluoromethanes: Chlorine AtomC-atalyzed (sic) Destruction of Ozone", by M. J. Molina et al. in *Nature*, vol. 249, 1974, pp. 810–812; "Global Trends in Total Ozone", by K. P. Bowman, in *Science*, vol. 239, 1988, pp. 48–50; and "Science of the Ozone Layer", by W. F. J. Evans, in *Chinook*, vol. 10, 1988, pp. 8–33.

In particular, the destruction of the earth's ozone layer has been attributed to the release of the chlorofluorocarbon gases into the atmosphere where they subsequently react with the ozone. Any decrease in stratospheric ozone may have serious effects since it influences weather patterns and shields the earth's surface from solar ultraviolet (UV) radiation. The latter could elevate the incidence of skin cancer and cataracts in humans, and may damage crops and phytoplankton (the basis of the oceanic food chain). In addition, rising levels of CFCs, together with methane (CH$_4$), nitrous oxide (N$_2$O) and carbon dioxide (CO$_2$) are enhancing the greenhouse effect, see above referenced article by Stolarski.

Furthermore, disruptions in weather patterns at the earth's poles, whose cold temperatures enhance the ozone depletion reactions, may have strategic implications for these regions. To date, the extent of ozone depletion has been most dramatic over Antarctica, where an ozone hole has appeared each southern spring since 1975, see the above referenced articles by T. E. Graedel et al., R. S. Stolarski, R. S. Stolarski et al., J. C. Farman et al., and "Excimer and Dye Lasers Sensing the Atmosphere", in *Lambda Highlights*, edited by U. Brinkmann, Gottingen, FRG, published by Lambda Physik GmbH, August 1988, pp. 1–3. In the past decade springtime ozone levels have diminished by about 50% over Antarctica. Preliminary global studies have shown depletions of from 2 to 10% have begun to occur during the winter and early spring in the middle to high latitudes of the northern hemisphere, see above referenced article by T. E. Graedel et al. For these reasons, there has been international cooperation to control the use of CFCs as exemplified by the 1987 Montreal Protocol, see above referenced article by R. N. Dubinsky. Potential regulations over the use and release of these gases may adversely affect many industries if the use and disposal of CFCs is not an environmentally sound technology.

CFCs are compounds containing chlorine (Cl), fluorine (F), carbon (C) and sometimes hydrogen (H). They are normally nontoxic, inert and cheap to manufacture. Their uses range from refrigerator coolants, cleaning solutions, propellants, plasma etchants in the microelectronics industry, and standard ingredients in plastic foams. The characteristics that make the CFCs inert allows them to remain in the free state for more than 100 years after being released into the troposphere, see above reference article by M. J. Molina et al. and "Release of Industrial Halocarbons and Tropospheric Budget", by J. P. Jesson in above referenced book by A. C. Aikin, editor, pp. 373–396. The CFCs slowly percolate into the stratosphere where the ozone layer resides from 15 to 50 kilometers above the earth's surface. Here, absorption of solar UV photons and subsequent dissociation results in destruction of the ozone catalytically by substances such as Cl and ClO$_x$. Stratospheric ozone (O$_3$) is formed when an oxygen molecule (O$_2$) is dissociated by solar UV radiation, the free oxygen atoms can then combine with another oxygen molecule to form ozone:

$$O_2 + h\nu \rightarrow O + O, \qquad [1]$$

$$O + O_2 \rightarrow O_3, \qquad [2]$$

Usually, photochemical reactions catalyzed by nitrous oxides (NO$_x$) remove ozone at a rate equal to the rate of its formation. Chlorine catalytic cycles can disturb this natural balance. The role of CFCs is that of a source of atomic chlorine which begins a cycle of chemical reactions, destroying ozone. An example of a common CFC released into the troposphere is dichlorodifluoromethane (CF$_2$Cl$_2$). Stratospheric photolytic dissociation by solar radiation creates two odd-electron species, one chlorine atom and one free radical:

$$CF_2Cl_2 + h\nu \rightarrow CF_2Cl + Cl. \qquad [3]$$

The cycle begins with the breakup of ozone by atomic chlorine and the formation of chlorine monoxide (ClO) and molecular oxygen (O$_2$):

$$Cl + O_3 \rightarrow ClO + O_2. \qquad [4]$$

Then the chlorine monoxide reacts with an oxygen atom formed by the photodissociation of another oxygen molecule (reaction equation [1] above) and liberates the chlorine which can initiate the cycle again:

$$ClO + O \rightarrow Cl + O_2. \qquad [5]$$

Under most conditions of the earth's ozone layer, reaction equation [5] above is a slower reaction than [4] because there is much lower concentration of oxygen atoms (O) than ozone ($O_3$).

Chlorine monoxide reactions with nitrogen oxides are a competing reaction that can remove chlorine from this cycle by combining to form chlorine nitrate ($ClNO_3$), see above referenced article by M. J. Molina et al. and "Free Radicals in the Earth's Stratosphere: A Review of Recent Results" by J. G. Anderson, in above referenced book edited by A. C. Aikin, pp. 233-251. However, at stratospheric temperatures ClO reacts with O six times faster than $NO_2$ reacts with O. Consequently, the Cl-ClO chain can be considerably more efficient than the $NO-NO_2$ chain in catalytic conversion of $O_3+O \rightarrow 2O_2$ per unit time, see above referenced article by M. J. Molina et al. It is generally agreed that after studies of the relative reaction rates described above, $ClO_x$ and Cl molecules from CFCs are the cause of stratospheric ozone depletion.

Users of large volumes of chlorofluorocarbons must currently release CFCs into the atmosphere because they cannot be decomposed and removed from the "waste" gases used in their particular process. Conventional scrubbers, filters, and CDOs (Controlled Decomposition and Oxidation Chambers or "burn boxes") are used to remove most toxic, corrosive and flammable gases used in industrial applications but do not affect chlorofluorocarbons because they are inert.

Thus, a continuing need exists in the state of the art for a laser controlled technique to induce decomposition of CFCs whereby the gases are broken down and the by-products are subsequently hydrolyzed and disposed of by conventional means.

SUMMARY OF THE INVENTION

The present invention is directed to providing a method and apparatus for decomposing chlorofluorocarbon gases enabling a conventional disposal of their by-products. The method includes placing the chlorofluorocarbon gas in a reaction chamber and including a Group IV chemical element-based mediating species (for example, silicon) in the reaction chamber prior to launching UV light into the reaction chamber. This causes a photo-decomposing or photodissociating of the chlorofluorocarbon gas into halocarbon and halogen radicals so that a reacting with the silicon (Si) or other Group IV chemical element-based mediating species in the reaction chamber can occur to form scrubable or hydrolyzable by-products. The apparatus includes a reaction chamber, a mediating species in the reaction chamber and a means for feeding the chlorofluorocarbon gas into the reaction chamber. An excimer laser radiates UV light into the reaction chamber so that photo-decomposing or photodissociating the chlorofluorocarbon gas into halocarbon and halogen radicals can occur. The halocarbon and halogen radicals react with the Si or other Group IV chemical element-based mediating species and these reaction by-products are evacuated from the reaction chamber and subsequently scrubbed and hydrolyzed, to create disposable by-products.

An object of the invention is to provide a practical, environmentally safe way to release chlorofluorocarbons into the atmosphere.

Another object is to provide a method for releasing chlorofluorocarbons employing a laser and Si-based mediating species to ensure increased effectiveness of the process.

Another object is to provide a method for releasing chlorofluorocarbons employing a laser and group IV chemical element-based mediating species to ensure increased effectiveness of the process.

Another object is to provide a method for decomposing chlorofluorocarbons having a greater efficiency with reduced associated complications.

Another object is to provide a method for decomposing chlorofluorocarbons relying on laser dissociation for the decomposition and disposal of the chlorofluorocarbons.

These and other objects of the invention will become more readily apparent to one skilled in the art to which this invention pertains in view of the ensuing specification when taken in conjunction with the claims and drawings.

DESCRIPTION OF THE PREFERRED EMBODIMENTS

Figure 1:
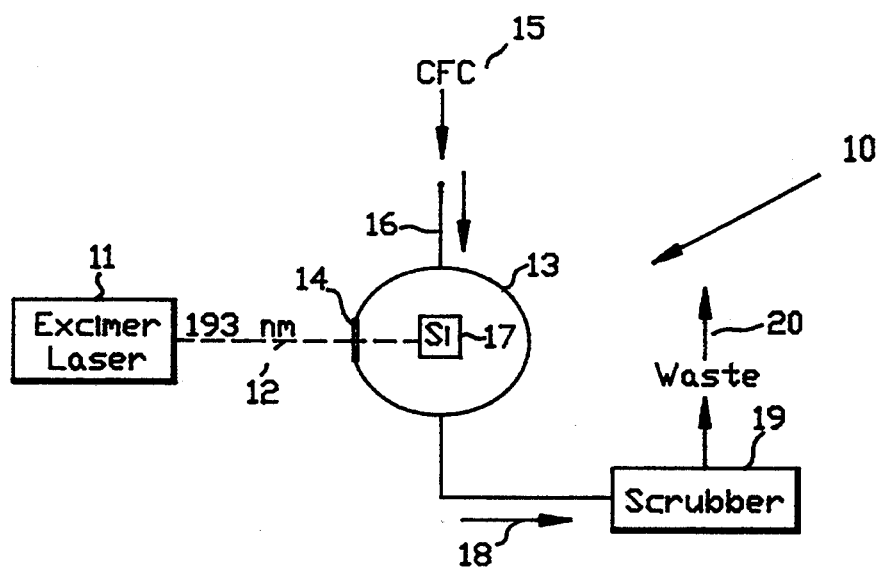
FIG. 1 depicts a typical embodiment of a laser controlled decomposition system for the laser controlled decomposition process.
Figure 3:
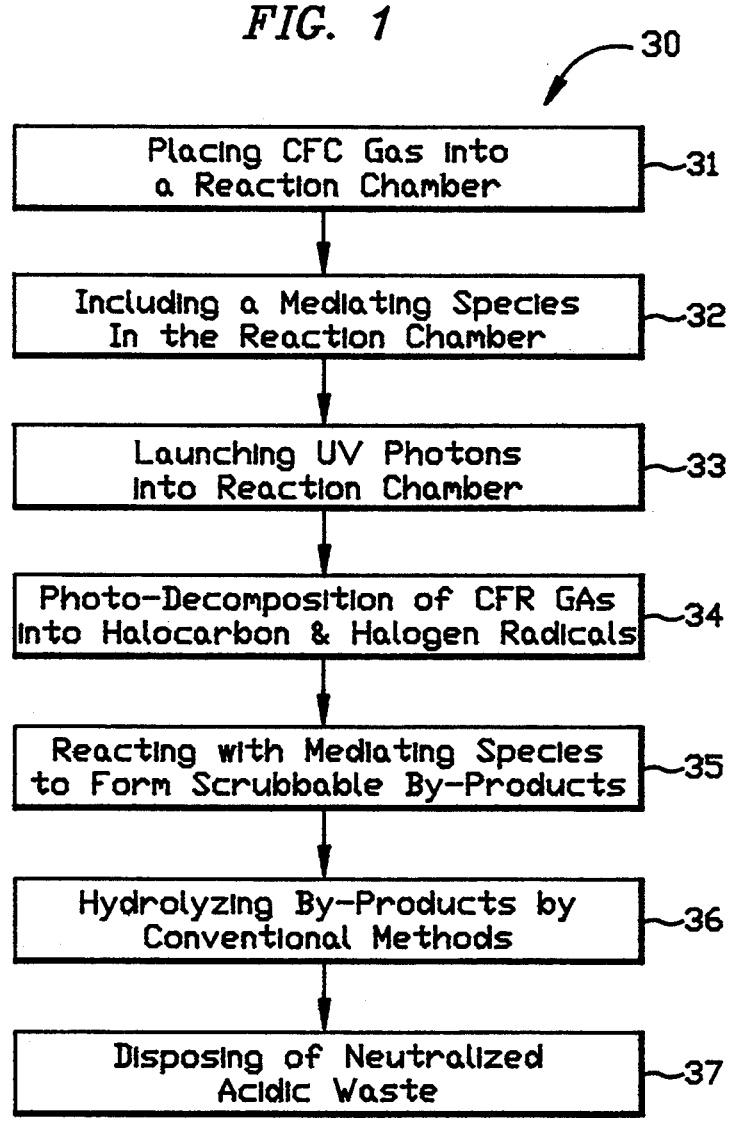
FIG. 3 shows a schematic of the laser controlled decomposition process.

FIG. 1 shows a schematic of one embodiment of a laser controlled decomposition system 10 for the laser controlled decomposition process 30 depicted in FIG. 3. An excimer laser 11 operating with an ArF gain medium (at 193 nm) launches UV light 12 into a laser controlled decomposition reaction chamber 13 through a window assembly 14. Chlorofluorocarbon (CFC) gases 15 are inserted into the reaction chamber via a CFC inlet 16 using conventional techniques and are maintained at a sufficiently high pressure to ensure efficient decomposition by incident UV light 12.

The reaction chamber is designed according to standard practices to handle toxic/corrosive gases or liquids obtained during the processing, and may be engineered for optimal photodecomposition by utilizing multi-pass resonators or multiple reflections to increase the path length of the UV photons of UV light 12 within the CFC ambient. In this embodiment, a Si-based mediating species 17, for example a solid silicon medium, in the reaction chamber reacts with the photodissociated radicals. UV light 12 from laser 11 is aligned to be incident on the Si-based mediating species to increase the reactivity photothermally. An effluent gas/liquid 18 is sent to a conventional scrubber 19 to hydrolyze and neutralize the by-products and thereby create a neutralized waste 20.

The use of an excimer laser is not a requirement to achieve photodecomposition of the chlorofluorocarbon gas; however, the high fluence of photons attainable with such a device will increase the effectiveness of the process. Excimer lasers have excellent "wall-plug" efficiency; however, their size and complexity may tend to limit their use in many applications. Similarly, there is no restriction to 193 nm light, but photons of sufficient energy are provided at 193 nm to cleave the halogen bonds; therefore, smaller continuous wave light sources such as mercury-xenon arc lamps may be appropriate for small-scale mobile processing.

FIG. 3 schematically shows the process 30 of laser controlled decomposition (LCD) of CFCs that calls for the placing 31 of chlorofluorocarbon gas 15 within LCD reaction chamber 13 that has an including 32 of a Si-based mediating species therein. Launching 33 of ultraviolet (UV) photons of UV light 12 from excimer laser 11 or an other high fluence source into LCD reaction chamber 13 in an either pulsed or continuous wave (CW) mode enables the photodissociation (or photodecomposition) 34 of the chlorofluorocarbon into halocarbon and halogen radicals.

The halocarbon and halogen radicals enable a spontaneous reacting 35 with a "mediating species" in this example a silicon based mediating species 17. The mediating species may be in a solid, liquid or gaseous form containing silicon (or other Group IV chemical element-based compound), whose reaction with these by-products provides an effluent which is easily hydrolyzed by a conventional scrubber 19 so that a hydrolyzing 36 by the conventional scrubbers can occur. The mediating species allows a halocarbon scavaging reaction (or chain reaction) to occur whose products can be treated and allow the disposing 37 thereof. Details of this process are described below.

Figure 2:
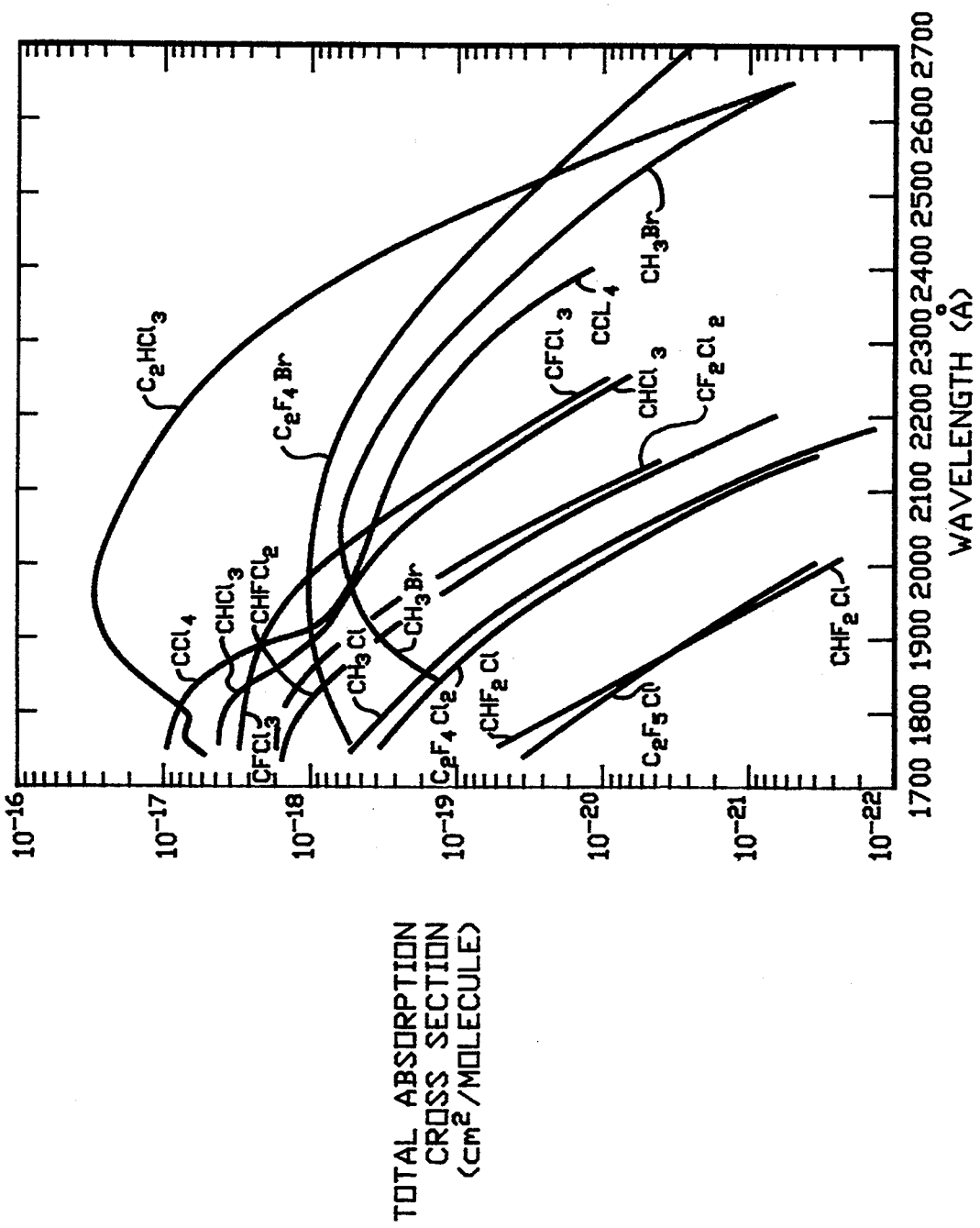
FIG. 2 depicts the absorption cross-section for common CFCs.

This process relies on the absorption properties of chlorofluorocarbons 15, and in some embodiments also the mediating species 17, in the UV region of the electromagnetic spectrum. FIG. 2 shows the absorption cross-section versus wavelength for a number of common chlorofluorocarbons, see "UV Photoabsorption Cross Sections for Halocarbons", by D. E. Robbins, in NASA-CR-154106, *Int. Conf. Probl. Relat. Stratos.*, pp. 255–257, 1976. There is strong absorption, particularly at wavelengths below 200 nm due to the C—X bonds (X=Cl,F). Typical bond energies of −485 kJ/mole (5 eV) for the C—X bonds, are easily cleaved by the 6.4 eV laser photons of an excimer laser operating at 193 nm (using an ArF gain medium). The halocarbon radicals produced by photolysis react with a silicon-based mediating species forming by-products which can be conventionally disposed. The process may be amplified by chain reactions.

Photothermal dissociation of CFC chloropentafluoro-ethane ($C_2ClF_5$) by an excimer laser has shown that the resulting by-products will react with elementary silicon, see "Excimer Laser-Assisted Etching of Silicon Using Chloropentafluoroethane", by S. D. Russell and D. A. Sexton, in R. Rosenberg, A. F. Bernhardt and J. G. Black, eds., *In-Situ Patterning: Selective Area Deposition and Etching*, Mat. Res. Soc. Proc., vol. 158, 1990, pp. 325–330. An example of the LCD process used to induce decomposition of $C_2ClF_5$ is given by:

(I) photolysis of the CFC according to the reaction $$C_2ClF_5 + h\nu \rightarrow C_2ClF_4 + F, \qquad [6]$$

(II) halogen reactions with a silicon mediating species produce $$Si + 4F \rightarrow SiF_4 \qquad [7]$$

$$Si + 4Cl \rightarrow SiCl_4, \qquad [8]$$

(III) and, photolysis of these by-products yields, for example:

$$SiCl_4 + h\nu \rightarrow SiCl_3 + Cl \qquad [9]$$

(IV) finally, reaction of the carbon centers with intermediate silicon species occurs. The reaction may go to completion by:

$$C_2ClF_4 + SiCl_3 \rightarrow C_2Cl_4 + SiF_4. \qquad [10]$$

The resulting product $C_2Cl_4$ is a colorless liquid (tetrachloroethylene) which is soluble in alcohol and ether, see *CRC Handbook of Chemistry and Physics*, edited by R. D. Weast, 67th ed., published in Boca Raton, Fla. by CRC Press, 1986, pp. B82 and B126–B127. The other product, silicon tetrafluoride, can be hydrolyzed as described below. Depending on the CFC to be processed and competing reactions, the LCD process will produce forms of silane/silicon carbides which can be conventionally decomposed through hydrolysis or by burning, see the above referenced book edited by R. D. Weast.

Silicon tetrafluoride is a colorless gas which forms a dense white mist in moist air and hydrolyses according to the overall equation, see the above referenced book edited by R. D. Weast,:

$$3SiF_4 + 2H_2O \rightarrow SiO_2 + 2H_2SiF_6. \qquad [11]$$

Silicon tetrafluoride is also readily prepared by direct halogenation of silicon and its alloys with elemental fluorine at room temperature through the reaction, see *Halogen Chemistry*, edited by V. Gutmann, Vol. 2, published in New York by Academic Press, 1967, pp. 173–180:

$$Si + 2F_2 \rightarrow SiF_4 + 360 \text{ kcal/mole.} \qquad [12]$$

The fluorination can also be carried out on $SiO_2$ in the absence of reducing agents because the bond energy Si—F (~90 kcal) is greater than that of Si—O (~70 kcal).

Reaction between the silicon within the LCD chamber and a chlorine radical also takes place spontaneously, resulting in the tetrahalide silicon tetrachloride ($SiCl_4$). The commercial use of silicon tetrachloride is for the production of silane by reducing with lithium, magnesium, sodium or calcium aluminum hydride in ethyl ether, see *Matheson Gas Data Book* by W. Braker and A. L. Mossman, published in Secaucus, N.J. by Matheson Gas Products, 1980, p. 633. Therefore, there is a large body of knowledge on the production of this gas. Silicon tetrachloride is almost exclusively made by chlorination with elementary chlorine of elementary silicon, silicon alloys and silicon compounds. Silicon tetrachloride is a colorless volatile liquid at ambient temperature, with a boiling point of 57.6° C. The liquid is a very reactive substance, whose best known reaction is hydrolysis with the evolution of hydrochloric acid (HCl) and simultaneous formation of a fine mist of silica which deposits as a white coating. This rapid and highly exothermic (70 kcal/mole) process takes place via the equation, see above referenced book edited by V. Gutmann:

$$SiCl_4 + 4H_2O \rightarrow Si(OH)_4 + 4HCl. \qquad [13]$$

In the gas phase, silicon tetrachloride does not react with water vapor unless HCl acceptors such as trimethylamine are present, see R. S. Stolarsky et al. referenced above.

The above teachings describe how the by-products of the LCD process can be hydrolyzed and conventionally decomposed; therefore, scrubbing schemes can effectively remove these from the effluent with subsequent standard neutralization and disposal of the waste acid.

As disclosed in the preceding paragraphs, the mediating species is not required to be in solid form. Gaseous silicon tetrafluoride and silicon tetrachloride and a variety of silanes are also subject to photodissociation in the UV; therefore, they can provide the source for the silicon-halogen reaction. Furthermore, the gaseous mediating species may aid the chain reactions necessary for efficient removal of the halocarbon radicals produced in the CFC photolysis.

Modifications to the design of the LCD chamber can be envisioned to optimize the pre-hydrolysis reactions depending on the composition of the reaction medium and the state (solid, liquid or gaseous) of the effluent desired for subsequent processing. For example, temperature variation of the reaction medium and/or the LCD chamber may be used to enhance or select a particular chemical reaction. Variations in the LCD chamber embodiment were also described in previous paragraphs.

In addition, depending on the rate of the photodissociation of the halogen by the UV light source, it may be desirable to contain the gas within the LCD chamber for some determined time period or reflow the gas for additional processing for complete decomposition. In some applications, ambients not entirely scrubbed of CFCs by the LCD procedure may be recirculated back into the original process for reuse while effluent is treated. Therefore, variations in design can be envisioned to optimize various portions of this decomposition scheme for efficient processing.

This processing scheme, although designed specifically for CFCs, may also be applied to any halocarbon. In addition, any Group IV chemical elements (and compounds containing them) may serve as acceptable substitutions to silicon for the decomposition reactions. Conceptually, any reaction with the carbon center will bind the halocarbon radical and may allow conventional disposal.

Obviously, many other modifications and variations of the present invention are possible in the light of the above teachings. It is therefore to be understood that within the scope of the inventive concept the invention may be practiced otherwise than as specifically claimed.

We claim:

1. A method of decomposing chlorofluorocarbon gas comprising:
    placing said chlorofluorocarbon gas in a reaction chamber;
    launching UV light into said reaction chamber;
    photo-decomposing or photodissociating said chlorofluorocarbon gas into halocarbon and halogen radicals;
    reacting with a silicon-based mediating species in said reaction chamber to form scrubable by-products; and
    hydrolyzing said by-products.

2. A method according to claim 1 further including:
    including said silicon-based mediating species in said reaction chamber prior to the step of launching.

3. A method according to claim 2 further including:
    disposing of said by-products.

4. A method according to claim 3 in which said photodecomposing or photodissociating said chlorofluorocarbon gas into halocarbon and halogen radicals is by reaction of said UV light and said silicon-based mediating species.

5. A method according to claim 3 in which said UV light is created in an excimer laser.

6. An apparatus for decomposing chlorofluorocarbon gas comprising:
    a reaction chamber;
    means for feeding said chlorofluorocarbon gas into said reaction chamber;
    means for radiating UV light into said reaction chamber;
    means disposed in said reaction chamber for photodecomposing or photo-dissociating said chlorofluorocarbon gas into halocarbon and halogen radicals; the photo-decomposing or photodissociating means includes a silicon-based mediating species in said reaction chamber to form scrubable by-products from said chlorofluorocarbon gas;
    means for evacuating said scrubable by-products from said reaction chamber; and
    means coupled to receive said scrubable by-products from the evacuating means for scrubbing to create disposable waste.

7. An apparatus according to claim 6 in which said silicon-based mediating species is silicon in a solid state.

8. An apparatus according to claim 6 in which said mediating species is silicon in a gaseous state.

9. An apparatus according to claim 6 in which said mediating species is silicon in a liquid state.

10. An apparatus according to claim 7, 8 or 9 in which the UV light radiating means is an excimer laser.

11. An apparatus according to claim 10 in which the means for scrubbing includes a means for hydrolyzing said by-products.

12. A method of decomposing chlorofluorocarbon gas comprising:
    placing said chlorofluorocarbon gas in a reaction chamber;
    launching UV light into said reaction chamber;
    photo-decomposing or photodissociating said chlorofluorocarbon gas into halocarbon and halogen radicals;
    reacting with a Group IV chemical element-based mediating species in said reaction chamber to form scrubable by-products; and
    hydrolyzing said by-products.

13. A method according to claim 12 further including:
    including said Group IV chemical element-based mediating species in said reaction chamber prior to the step of launching.

14. A method according to claim 13 in which said photodecomposing or photodissociating said chlorofluorocarbon gas into halocarbon and halogen radicals is by reaction of said UV light and said Group IV chemical element-based mediating species.

15. An apparatus for decomposing chlorofluorocarbon gas comprising:
    a reaction chamber;
    means for feeding said chlorofluorocarbon gas into said reaction chamber;
    means for radiating UV light into said reaction chamber;
    means disposed in said reaction chamber for photodecomposing or photo-dissociating said chlorofluorocarbon gas into halocarbon and halogen radicals; the photo-decomposing or photodissociating means includes a Group IV chemical element-based mediating species in said reaction chamber to form scrubable by-products from said chlorofluorocarbon gas;

means for evacuating said scrubable by-products from said reaction chamber; and means coupled to receive said scrubable by-products from the evacuating means for scrubbing to create disposable waste.

16. An apparatus according to claim 15 in which said Group IV chemical element-based mediating species is in a solid state.

17. An apparatus according to claim 15 in which said Group IV chemical element-based mediating species is in a liquid state.

18. An apparatus according to claim 15 in which said Group IV chemical element-based mediating species is in a gaseous state.

* * * * *